(12) United States Patent
Inukai et al.

(10) Patent No.: US 6,954,161 B2
(45) Date of Patent: Oct. 11, 2005

(54) CASCADE DELTA-SIGMA MODULATOR

(75) Inventors: Fumihito Inukai, Kyoto (JP); Akio Yokoyama, Ibaraki (JP); Hitoshi Kobayashi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/865,885

(22) Filed: Jun. 14, 2004

(65) Prior Publication Data

US 2005/0001751 A1 Jan. 6, 2005

(30) Foreign Application Priority Data

Jul. 4, 2003 (JP) ........................................ 2003-192177

(51) Int. Cl.[7] .............................................. H03M 3/00
(52) U.S. Cl. ....................................................... 341/143
(58) Field of Search ........................................ 341/143

(56) References Cited

U.S. PATENT DOCUMENTS

| | | | |
|---|---|---|---|
| 4,704,600 A | | 11/1987 | Uchimura |
| 4,851,841 A | | 7/1989 | Sooch |
| 5,061,928 A | * | 10/1991 | Karema et al. ............ 341/143 |
| 5,103,229 A | * | 4/1992 | Ribner ........................ 341/143 |
| 5,298,900 A | * | 3/1994 | Mauthe et al. ............. 341/143 |
| 5,629,701 A | * | 5/1997 | Ritoniemi et al. .......... 341/143 |
| 6,795,002 B2 | * | 9/2004 | Gupta ......................... 341/143 |

FOREIGN PATENT DOCUMENTS

JP          61177818          8/1986

* cited by examiner

Primary Examiner—Howard L. Williams
(74) Attorney, Agent, or Firm—Stevens, Davis, Miller & Mosher, LLP

(57) ABSTRACT

A delta-sigma modulation quantization loop, comprising an integration circuit for integrating the difference between an analog input signal and a feedback reference voltage, a local quantizer for quantizing the output of the integration circuit into a digital signal, and a DA converter for generating the feedback reference voltage from the digital output of the local quantizer, is used as a single stage, and a plurality of the stages are cascade-connected. In the second-stage and subsequent modulation quantization loops, the difference signal between the input of the local quantizer of the previous stage and the output of the DA converter of the previous stage is used as an analog input signal. The feedback reference voltages of the respective delta-sigma modulation quantization loops are set individually so as to be higher than the specified maximum voltage of the analog input signal to limit the gains of the respective delta-sigma modulation quantization loops. Gain setting devices are provided in a noise reduction circuit to roughly compensate the gains limited in the respective delta-sigma modulation quantization loops.

10 Claims, 6 Drawing Sheets

CASCADE DELTA-SIGMA MODULATOR

BACKGROUND OF THE INVENTION

1. Field of the Invention

The present invention relates to a cascade delta-sigma modulation quantizer, and more particularly to a cascade delta-sigma modulator capable of obtaining full-scale output by preventing S/N ratio reduction caused in the vicinity of the input full-scale range.

2. Prior Art

A/D converter circuits incorporating delta-sigma modulators have been known conventionally. FIG. 3 shows an A/D converter circuit incorporating a single-stage delta-sigma modulator in accordance with a prior art. A delta-sigma modulator 1 comprises an integration circuit 2 to which an analog input signal and a feedback reference voltage (positive voltage $V_{REF+}$ or negative voltage $V_{REF-}$) are input, a quantizer 3 for quantizing the output of the integration circuit 2 into a digital signal, and a DA converter 4 for generating the above-mentioned feedback reference voltage from the digital output of the quantizer 3. The above-mentioned positive and negative reference voltages are usually set so as to be the same as the specified positive/negative maximum voltages of the analog input signal.

The output signal of the delta-sigma modulator 1 is input to a digital decimation filter 5 as digital codes. A low-frequency component corresponding to the analog input signal component is extracted and converted into digital data having a predetermined bit number.

In order to reduce noise in the output digital signal of this type of A/D converter, a scaling system is proposed wherein the gain of the delta-sigma modulator 1 is limited to 1/A (A is any given numeric value larger than 1), and gain A is given to the decimation filter 5 by using its impulse response coefficient (refer to U.S. Pat. No. 4,851,841).

This is resulted from the consideration that the A/D converter circuit shown in FIG. 3 has a noise characteristic shown in FIG. 5 depending on the level of the analog input signal. In FIG. 5, curve A indicates the characteristic of noise in the digital output depending on the level of the analog input signal in the single-stage delta-sigma modulator. In addition, curve B indicates the characteristic of noise in the digital output depending on the level of the analog input signal in a cascade delta-sigma modulator.

As shown in FIG. 5, the A/D converter circuit shown in FIG. 3 gets into an "overload" state wherein the noise in the digital output increases when the level of the analog input signal is close to its full-scale level, that is, the feedback reference voltage of the delta-sigma modulator 1.

Hence, the feedback reference voltage is set so that each of the specified positive/negative maximum voltages of the analog input signal is 1/A (for example, 1/A=0.7) of the positive/negative feedback reference voltages. Hence, the gain of the delta-sigma modulator 1 is limited to 1/A. However, gain A (referred to as a scaling coefficient) is given to the decimation filter 5 provided at the later stage, whereby the gain limited by the delta-sigma modulator is compensated. Since this kind of scaling is carried out, the noise can be reduced effectively. The higher the order of the integrator incorporated in a delta-sigma modulator, the lower the input level at which overload occurs. For this reason, it is necessary to increase the scaling coefficient.

In addition, in delta-sigma modulators of recent years, a configuration referred to as a cascade configuration is used frequently to make an attempt for minimizing overload as shown in FIG. 5. A cascade delta-sigma modulator is defined as a modulator having two or more delta-sigma modulator stages comprising a first-order or multi-order integrator and cascade-connected with one another, as disclosed in Japanese Laid-open Patent Application Sho 61-177818 (the patent publication of unexamined application, the number of which is cited herein, is incorporated in this specification by reference).

FIG. 4 is a block diagram showing an A/D converter incorporating a cascade delta-sigma modulator. A cascade delta-sigma modulator 7 comprises a first-stage delta-sigma modulation quantization loop 11, second-stage to nth-stage (n is an integer of 3 or more) delta-sigma modulation quantization loops, that is, second-stage and subsequent sigma modulation quantization loops 12 to 1n, cascade-connected to the first-stage delta-sigma modulation quantization loop 11, and a noise reduction circuit 6 for reducing noise by synthesizing the outputs of the first-stage to nth-stage delta-sigma modulation quantization loops 11 to 1n. A two-stage configuration comprising the first-stage and second-stage delta-sigma modulation quantization loops may also be used. In other words, the number of the second-stage and subsequent sigma modulation quantization loops cascade-connected to the first-stage delta-sigma modulation quantization loop may be one or more.

The first-stage delta-sigma modulation quantization loop 11 comprises an integration circuit 2 to which an external analog input signal, the positive/negative maximum voltages of which are specified, and a feedback reference voltage are input, a local quantizer 3 for quantizing the output of the integration circuit 2 into a digital signal, and a DA converter 4 for generating the above-mentioned feedback reference voltage from the digital output of the local quantizer 3. This loop is used as a unit stage.

Each of the second-stage and subsequent sigma modulation quantization loops 12 to 1n comprises the integration circuit 2, the local quantizer 3 and the DA converter 4, just as in the case of the first-stage delta-sigma modulation quantization loop 11.

However, each of the analog signals input to the second-stage and subsequent sigma modulation quantization loops 12 to in is the difference signal between the input of the local quantizer 3 of the previous-stage delta-sigma modulation quantization loop and the output of the DA converter 4 of the previous-stage delta-sigma modulation quantization loop. This difference signal corresponds to the quantization error generated by the local quantizer 3 of the previous-stage delta-sigma modulation quantization loop. Furthermore, the local quantizer 3 in each of the second-stage and subsequent sigma modulation quantization loops 12 to in quantizes the analog input signal formed of the quantization error.

For example, the difference signal between the input of the local quantizer 3 of the first-stage delta-sigma modulation quantization loop 11 and the output of the DA converter 4 of the first-stage delta-sigma modulation quantization loop 11 is input to the integration circuit 2 of the second-stage delta-sigma modulation quantization loop 12 as an analog signal. This difference signal corresponds to the quantization error generated by the local quantizer 3 of the first-stage delta-sigma modulation quantization loop 11. Furthermore, the local quantizer 3 of the second-stage delta-sigma modulation quantization loop 12 quantizes the analog input signal formed of the quantization error.

An analog signal similar to that described above is input from the second-stage delta-sigma modulation quantization loop 12 to the third-stage delta-sigma modulation quantization loop 13, and an operation similar to that of the second-stage delta-sigma modulation quantization loop 12 is carried out. Operations in the fourth-stage and subsequent loops are similar to that of the third-stage loop.

The noise reduction circuit 6 has a configuration wherein the signal obtained by delaying the output signal of the local quantizer 3 of each of the delta-sigma modulation quantization loops 11 to 1(n−1) is added to the signal obtained by differentiating the output signal of the local quantizer 3 of each of the next-stage delta-sigma modulation quantization loops 12 to 1n, and the signal obtained by the addition is used as the output signal of the cascade delta-sigma modulator 7.

More specifically, in the case of a two-stage configuration, for example, in the noise reduction circuit 6, the signal obtained by delaying the output signal of the local quantizer 3 of the first delta-sigma modulation quantization loop 11 is added to the signal obtained by differentiating the output signal of the local quantizer 3 of the second-stage delta-sigma modulation quantization loop 12, and the signal obtained by the addition is used as the output signal of the cascade delta-sigma modulator 7.

In the case when the third-stage delta-sigma modulation quantization loop 13 is present, the signal obtained by delaying the output signal of the local quantizer 3 of the second delta-sigma modulation quantization loop 12 is added to the signal obtained by differentiating the output signal of the local quantizer 3 of the third-stage delta-sigma modulation quantization loop 13, and the signal obtained by the addition is used instead of the output signal of the local quantizer 3 of the second-stage delta-sigma modulation quantization loop 12, in the above-mentioned operation, whereby the output signal of the cascade delta-sigma modulator 7 is calculated. Similar operations are carried out in the case when the fourth and subsequent delta-sigma modulation quantization loops are present.

With this configuration, quantization noise generated in each of the delta-sigma modulation quantization loops 11 to 1(n−1) can be canceled by the next-stage delta-sigma modulation quantization loops 12 to 1n respectively corresponding thereto.

The output signal of the cascade delta-sigma modulator 7 is input to the digital decimation filter 5 as digital codes. In the digital decimation filter 5, a low-frequency component corresponding to the analog input signal component is extracted and converted into digital data having a predetermined bit number.

FIG. 6 is a block diagram showing an A/D converter incorporating a 1:2 cascade delta-sigma modulator as a specific configuration example of the cascade delta-sigma modulator shown in FIG. 4. A 1:2 cascade delta-sigma modulator 51 comprises a first-stage delta-sigma modulation quantization loop 52 provided with a first-order integration circuit 54, a second-stage delta-sigma modulation quantization loop 53 provided with a second-order integration circuit 55, and a noise reduction circuit 56.

The first-stage delta-sigma modulation quantization loop 52 comprises an integrator 61, a local quantizer 62, and a 1-bit DA converter 63. The signal obtained by passing the feedback reference voltage generated by the DA converter 63 through an amplifier 64 is subtracted from an external analog input signal by an adder/subtracter 65, and the signal obtained by the subtraction is input to the integrator 61. The local quantizer 62 quantizes the output of the integrator 61 into a 1-bit digital signal. The DA converter 63 generates the above-mentioned feedback reference voltage from the digital output Y1 of the local quantizer 62. The integrator 61, the amplifier 64 and the adder/subtracter 65 form the integration circuit 54.

The second-stage delta-sigma modulation quantization loop 53 comprises an integrator 71, an integrator 72, a local quantizer 73, and a 1-bit DA converter 74. The signal obtained by passing the feedback reference voltage generated by the DA converter 74 through an amplifier 75 is subtracted by an adder/subtracter 77 from the difference signal between the input of the local quantizer 62 and the output of the DA converter 63 of the first-stage delta-sigma modulation quantization loop 52, that is, the quantization error Q1 generated by the local quantizer 62 of the first-stage delta-sigma modulation quantization loop 52, and the signal obtained by the subtraction is input to the integrator 71. The signal obtained by passing the feedback reference voltage generated by the DA converter 74 through an amplifier 76 is subtracted from the output of the integrator 71 by an adder/subtracter 78, and the signal obtained by the subtraction is input to the integrator 72. The local quantizer 73 quantizes the output of the integrator 72 into a 1-bit digital signal. The DA converter 74 generates the above-mentioned feedback reference voltage from the digital output Y2 of the local quantizer 73. The integrators 71 and 72, the amplifiers 75 and 76 and the adders/subtracters 77 and 78 form the integration circuit 55.

Both the scaling coefficients of the above-mentioned first-stage and second-stage delta-sigma modulation quantization loops 52 and 53 are set at A (A is any given numeric value larger than 1); in other words, they are set at the same value. In the first-stage and second-stage delta-sigma modulation quantization loops 52 and 53, the gain is limited to 1/A. The scaling coefficient A is herein attained by setting the level of the feedback reference voltage so that the specified positive/negative maximum voltages of the analog input signal are 1/A of the positive/negative feedback reference voltages, respectively, as described above.

In FIG. 6, reference code Q1 designates the quantization error generated across the local quantizer 62, and reference code Q2 designates the quantization error generated across the local quantizer 73. Reference code N designates analog noise, other than quantization noise, such as noise mixed in the analog input signal and input-converted thermal noise.

The noise reduction circuit 56 is connected so as to receive the output signals Y1 and Y2 of the delta-sigma modulation quantization loops 52 and 53, respectively. A delay device 81 is connected so as to receive the output Y1 and operates to delay the data of the output Y1 with respect to the data of the output Y2 in terms of time when the data of the output Y1 is sent to an adder 83. A differentiator 82 is formed of a digital differentiator that carries out differentiation in accordance with the known prior art method. The output of the digital differentiator 82 is added to the output of the delay device 81 by the adder 83, and the signal obtained by the addition becomes the output signal Y of the 1:2 cascade delta-sigma modulator 51. This output signal Y is given to a digital decimation filter 57 as digital codes.

As a result, when it is assumed that the coefficients g1 and g2 of the amplifiers 64 and 75 are set at 1 and that the coefficient g3 of the amplifier 76 is set at 2, for example, the output Y of the 1:2 cascade delta-sigma modulator 51 can be represented by the following transfer function:

$$Y1 = Vin/A + N + (1-Z^{-1})Q1 \quad (1)$$

$$Y2 = -Q1 + (1-Z^{-1})^2 Q2 \quad (2)$$

$$Y = Y1 + Y2 \cdot (1 - Z^{-1}) \quad (3)$$
$$= Vin/A + N + (1 - Z^{-1})^3 Q2$$

The output Dout of the digital decimation filter 57 is represented by the following function:

$$Dout = Y \cdot A \quad (4)$$
$$= Vin + [N + (1 - Z^{-1})^3 Q2] \cdot A$$

Hence, S/N ratio deterioration at the time of the maximum signal input can be prevented by the gain scaling. However, the analog noise component N and the quantization noise component $(1-Z^{-1})^3 Q2$ are multiplied by A, whereby the S/N ratio is sacrificed.

In order that a delta-sigma modulator satisfying a high S/N ratio of 90 dB or more is attained, the S/N characteristic is required to be improved further. In this kind of high-performance delta-sigma modulator, analog noise rather than quantization noise is dominant in the signal frequency range. This is based on the following reason. In the case of the quantization noise component in the signal frequency range, the theoretical performance of an S/N ratio of 100 dB or more can be attained by increasing the order of quantization. However, in the case of the analog noise component, it is difficult to attain an S/N ratio of 90 dB or more. Hence, for the improvement of the S/N ratio, it is important to solve the problem of how to prevent the increase in the analog noise component owing to scaling.

Furthermore, as another problem, in the conventional gain scaling, the modulator is required to be designed in combination with the decimation filter provided in the later stage, resulting in a defect of low freedom of design.

SUMMARY OF THE INVENTION

In order to solve the above-mentioned problems, the present invention is intended to provide a cascade delta-sigma modulator capable of preventing S/N ratio deterioration owing to gain scaling and thereby capable of effectively reducing the influence of analog noise.

A delta-sigma modulator in accordance with a first inversion comprises a first-stage delta-sigma modulation quantization loop, one or more delta-sigma modulation quantization loops, that is, second-stage and subsequent delta-sigma modulation quantization loops, and a noise reduction circuit. The delta-sigma modulator further comprises gain limiting means and scale compensating means.

The first-stage delta-sigma modulation quantization loop comprises a first integration circuit to which a first analog input signal, the maximum voltage of which is specified, and a first feedback reference voltage are input, a first local quantizer for quantizing the output of the first integration circuit into a digital signal, and a first DA converter for generating the first feedback reference voltage from the digital output of the first local quantizer.

Each of the second-stage and subsequent delta-sigma modulation quantization loops comprises a second integration circuit to which a second analog input signal formed of the difference signal between the input of the local quantizer and the output of the DA converter of the previous-stage delta-sigma modulation quantization loop and a second feedback reference voltage are input, a second local quantizer for quantizing the output of the second integration circuit into a digital signal, and a second DA converter for generating the second feedback reference voltage from the digital output of the second local quantizer. The second-stage and subsequent delta-sigma modulation quantization loops are cascade-connected to the first-stage delta-sigma modulation quantization loop.

In the noise reduction circuit, with respect to the first-stage, second-stage and subsequent delta-sigma modulation quantization loops, the output obtained by delaying the output of the local quantizer of each delta-sigma modulation quantization loop using a delay device is added to the output obtained by differentiating the output of the local quantizer of the next-stage delta-sigma modulation quantization loop using a differentiator. The value obtained by the addition is used as the output signal of the noise reduction circuit, whereby the quantization noise of each delta-sigma modulation quantization loop is canceled.

In addition, the gain limiting means limits the gain of each delta-sigma modulation quantization loop by setting the feedback reference voltage of each delta-sigma modulation quantization loop at the specified maximum voltage or more of the analog input signal and by setting the feedback reference voltage of each delta-sigma modulation quantization loop so as to be independent of the feedback reference voltages of the other delta-sigma modulation quantization loops.

Furthermore, the scale compensating means compensates the gain limited in each delta-sigma modulation quantization loop by independently setting the gain in the noise reduction circuit for each delta-sigma modulation quantization loop.

A delta-sigma modulator in accordance with a second inversion comprises a first-stage delta-sigma modulation quantization loop, one or more delta-sigma modulation quantization loops, that is, second-stage and subsequent delta-sigma modulation quantization loops, and a noise reduction circuit. The delta-sigma modulator further comprises gain limiting means and scale compensating means.

The first-stage delta-sigma modulation quantization loop comprises a first integration circuit to which a first analog input signal, the maximum voltage of which is specified, and a first feedback reference voltage are input, a first local quantizer for quantizing the output of the first integration circuit into a digital signal, and a first DA converter for generating the first feedback reference voltage from the digital output of the first local quantizer.

Each of the second-stage and subsequent delta-sigma modulation quantization loops comprises a second integration circuit to which a second analog input signal formed of the input of the local quantizer of the previous-stage delta-sigma modulation quantization loop and a second feedback reference voltage are input, a second local quantizer for quantizing the output of the second integration circuit into a digital signal, and a second DA converter for generating the second feedback reference voltage from the digital output of the second local quantizer. The second-stage and subsequent delta-sigma modulation quantization loops are cascade-connected to the first-stage delta-sigma modulation quantization loop.

In the noise reduction circuit, with respect to the first-stage, second-stage and subsequent delta-sigma modulation quantization loops, the output obtained by delaying the output of the local quantizer of each delta-sigma modulation quantization loop using a delay device is added to the output obtained by differentiating the output of the local quantizer of the next-stage delta-sigma modulation quantization loop using a differentiator. The value obtained by the addition is used as the output signal of the noise reduction circuit, whereby the quantization noise of each delta-sigma modulation quantization loop is canceled.

In addition, the gain limiting means limits the gain of each delta-sigma modulation quantization loop by setting the feedback reference voltage of each delta-sigma modulation quantization loop at the specified maximum voltage or more of the above-mentioned analog input signal and by setting the feedback reference voltage of each delta-sigma modulation quantization loop so as to be independent of the feedback reference voltages of the other delta-sigma modulation quantization loops.

Furthermore, the scale compensating means compensates the gain limited in each delta-sigma modulation quantization loop by independently setting the gain in the noise reduction circuit for each delta-sigma modulation quantization loop.

In the above-mentioned first and second inventions, the feedback reference voltage of each delta-sigma modulation quantization loop is set so as to be independent of the feedback reference voltages of the other delta-sigma modulation quantization loops. However, the feedback reference voltages of the delta-sigma modulation quantization loops are set not only at values different from each other but also at the same value in some cases. The point is that the values can be selected as desired depending on the configuration of each delta-sigma modulation quantization loop.

In addition, the feedback reference voltage of each delta-sigma modulation quantization loop is set at the specified maximum voltage of the analog input signal or higher. In other words, the above-mentioned feedback reference voltage is set so as to be the same as or higher than the specified maximum voltage of the analog input signal.

In the case when the delay device and the differentiator are provided in the input section of the noise reduction circuit from each delta-sigma modulation quantization loop, the above-mentioned scale compensating means is formed of multiplying means provided on the input sides or the output sides of the delay device and the differentiator provided in the input section of the noise reduction circuit from each delta-sigma modulation quantization loop, for example. This multiplying means multiplies the coefficient for compensating the gain limited in each delta-sigma modulation quantization loop to the signals passing through the delay device and the differentiator.

With the configuration of the present invention, the feedback reference voltage of each delta-sigma modulation quantization loop is set independently, whereby the gain scaling coefficient is set independently for each delta-sigma modulation quantization loop. By using the gain scaling coefficient, gain scaling is carried out in the cascade delta-sigma modulator. Furthermore, in the noise reduction circuit, the gain is set independently for each delta-sigma modulation quantization loop, whereby the gain limited in each delta-sigma modulation quantization loop is compensated. Hence, the gain scaling coefficient can be set optimally depending on, for example, the order of the integration circuit provided in each delta-sigma modulation quantization loop. As a result, the increase in analog noise owing to gain scaling can be minimized. Therefore, it is possible to attain a cascade delta-sigma modulator capable of preventing S/N ratio deterioration and capable of effectively reducing the influence of analog noise.

Furthermore, since the gain limited in each delta-sigma modulation quantization loop is compensated by the noise reduction circuit, the gain of the decimation filter may remain fixed at 1, for example, at the time of gain scaling. Therefore, when the delta-sigma modulation A/D converter is designed, it is not necessary to consider the design of the decimation filter provided in the later stage, whereby the freedom of design can be enhanced.

Moreover, gain compensation can be carried out accurately for each delta-sigma modulation quantization loop, and errors can be reduced by providing gain setting devices for individually setting gain limiting values in the input section of the noise reduction circuit from each delta-sigma modulation quantization loop.

Still further, it is preferable that the gain limiting means sets the feedback reference voltage differently depending on the order of the integration circuit in each delta-sigma modulation quantization loop.

DESCRIPTION OF PREFERRED EMBODIMENTS

An embodiment in accordance with the present invention will be described below referring to FIG. 1.

Figure 1:
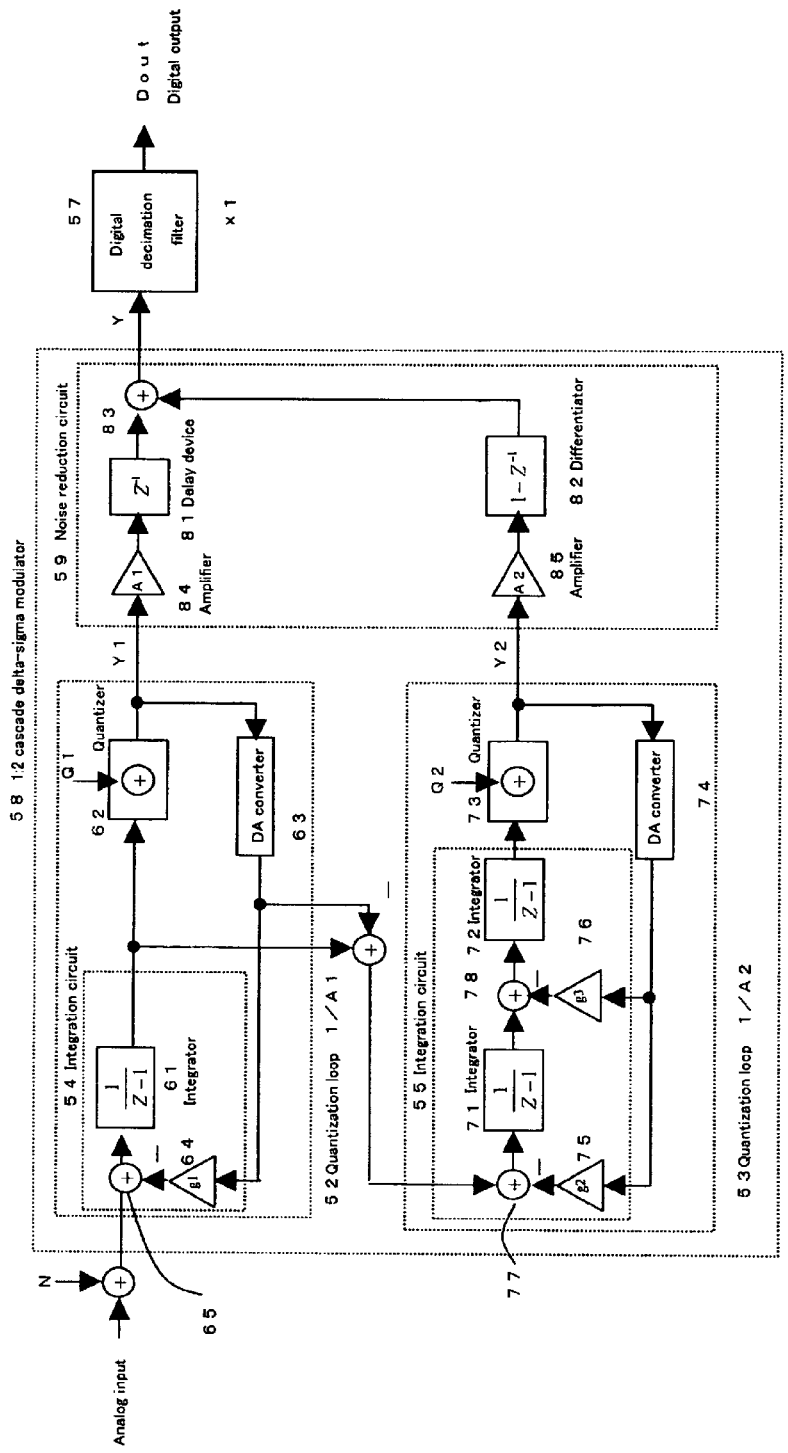
FIG. 1 is a block diagram showing the configuration of an A/D converter circuit incorporating a 1:2 cascade delta-sigma modulator in accordance with a first embodiment of the present invention.

FIG. 1 is a block diagram showing an A/D converter incorporating a 1:2 cascade delta-sigma modulator in accordance with a first embodiment of the present invention.

A 1:2 cascade delta-sigma modulator 58 comprises a first-stage delta-sigma modulation quantization loop 52 provided with a first-order integration circuit 54, a second-stage delta-sigma modulation quantization loop 53 provided with a second-order integration circuit 55, and a noise reduction circuit 59.

The first-stage delta-sigma modulation quantization loop 52 comprises an integrator 61, a local quantizer 62, and a 1-bit DA converter 63. The signal obtained by passing the feedback reference voltage generated by the DA converter 63 through an amplifier 64 is subtracted from an external analog input signal by an adder/subtracter 65, and the signal obtained by the subtraction is input to the integrator 61. The local quantizer 62 quantizes the output of the integrator 61 into a 1-bit digital signal. The DA converter 63 generates the above-mentioned feedback reference voltage from the digital output Y1 of the local quantizer 62. The integrator 61, the amplifier 64 and the adder/subtracter 65 form the integration circuit 54. The local quantizer may have a multivalued configuration, that is, a configuration of 2 bits or more. In this case, in conformity with this configuration, the DA converter is also configured so as to have a multivalued configuration, that is, a configuration of 2 bits or more.

The second-stage delta-sigma modulation quantization loop 53 comprises an integrator 71, an integrator 72, a local quantizer 73, and a 1-bit DA converter 74. The signal obtained by passing the feedback reference voltage generated by the DA converter 74 through an amplifier 75 is subtracted by an adder/subtracter 77 from the difference signal between the input of the local quantizer 62 and the output of the DA converter 63 of the first-stage delta-sigma modulation quantization loop 52, that is, the quantization error Q1 generated by the local quantizer 62 of the first-stage delta-sigma modulation quantization loop 52, and the signal obtained by the subtraction is input to the integrator 71. The signal obtained by passing the feedback reference voltage generated by the DA converter 74 through an amplifier 76 is subtracted from the output of the integrator 71 by an adder/subtracter 78, and the signal obtained by the subtraction is input to the integrator 72. The local quantizer 73 quantizes the output of the integrator 72 into a 1-bit digital signal. The DA converter 74 generates the above-mentioned feedback reference voltage from the digital output Y2 of the local quantizer 73. The integrators 71 and 72, the amplifiers 75 and 76 and the adders/subtracters 77 and 78 form the integration circuit 55.

The scaling coefficient of the above-mentioned first-stage delta-sigma modulation quantization loop 52 is set at A1 (A1 is any given numeric value not less than 1), and the scaling coefficient of the second-stage delta-sigma modulation quantization loop 53 is set at A2 (A2 is any given numeric value not less than 1). Since the orders of the integration circuits 54 and 55 of the first-stage and second-stage delta-sigma modulation quantization loops 52 and 53 are different from each other, the scaling coefficients A1 and A2 are set at different values. As a result, in the first-stage and second-stage delta-sigma modulation quantization loops 52 and 53, the gains are limited to 1/A1 and 1/A2, respectively. In the case of this example, the scaling coefficients are set at 1/A1=1 and 1/A2=0.7, for example.

The above-mentioned DA converters 63 and 74 carry out setting so that the positive/negative reference voltages of the first-stage and second-stage delta-sigma modulation quantization loops 52 and 53 are higher than the specified positive/negative maximum voltages of the analog input signal and so that the feedback reference voltage of each delta-sigma modulation quantization loop is set so as to be independent of the feedback reference voltages of the other delta-sigma modulation quantization loops. Hence, the DA converters 63 and 74 are used as gain limiting means for limiting the gains of the first-stage and second-stage delta-sigma modulation quantization loops 52 and 53.

The above-mentioned gain limiting means sets the feedback reference voltage depending on the order of the integration circuit in each delta-sigma modulation quantization loop, for example. Hence, the feedback reference voltages in the respective stages have values different depending on the order of the integration circuit, for example.

In the above-mentioned configuration, the feedback reference voltage of each of the delta-sigma modulation quantization loops 52 and 53 is set so as to be independent of the feedback reference voltages of the other delta-sigma modulation quantization loops. However, the feedback reference voltages of the delta-sigma modulation quantization loops 52 and 53 are set not only at values different from each other but also at the same value in some cases. The point is that the values can be selected as desired depending on the configuration of each of the delta-sigma modulation quantization loops 52 and 53.

In addition, the feedback reference voltage of each of the delta-sigma modulation quantization loops 52 and 53 is set at the specified maximum voltage of the analog input signal or higher. In other words, the above-mentioned feedback reference voltage is set so as to be the same as or higher than the specified maximum voltage of the analog input signal.

In FIG. 1, reference code Q1 designates the quantization error generated across the local quantizer 62, and reference code Q2 designates the quantization error generated across the local quantizer 73. Reference code N designates analog noise, other than quantization noise, such as noise mixed in the analog input signal and input-converted thermal noise.

The noise reduction circuit 59 is connected so as to receive the output signals Y1 and Y2 of the delta-sigma modulation quantization loops 52 and 53. A delay device 81 is connected so as to receive the output Y1 and operates to delay the data of the output Y1 with respect to the data of the output Y2 in terms of time when the data of the output Y1 is sent to an adder 83. A differentiator 82 is formed of a digital differentiator that carries out differentiation in accordance with the known prior art method. The output of the digital differentiator 82 is added to the output of the delay device 81 by the adder 83, and the signal obtained by the addition becomes the output signal Y of the 1:2 cascade delta-sigma modulator 58. This output signal Y is given to a digital decimation filter 57 as digital codes. The gain of an amplifier 84 is set at A1, and the gain of an amplifier 85 is set at A2.

Since the gains are set by the above-mentioned amplifiers 84 and 85 in the noise reduction circuit 59, the amplifiers 84 and 85 correspond to scale compensating means for compensating the gains limited in the delta-sigma modulation quantization loops 52 and 53.

In addition, the above-mentioned amplifiers 84 and 85 are provided on the input sides or the output sides of the delay device 81 and the differentiator 82 provided in the input section of the noise reduction circuit 59 from the delta-sigma modulation quantization loops 52 and 53, respectively, thereby configuring multiplying means wherein the coefficients for compensating the gains limited in the delta-sigma modulation quantization loops 52 and 53 are multiplied to the signals passing through the delay device 81 and the differentiator 82. Although the amplifiers 84 and 85 are provided on the input sides of the delay device 81 and the differentiator 82 in FIG. 1, they may be provided on the output sides.

Furthermore, the above-mentioned amplifiers 84 and 85 are configured so as to be used as gain setting devices for individually setting gain limiting values in the input section of the noise reduction circuit 59 from the delta-sigma modulation quantization loops 52 and 53.

As a result, when it is assumed that the coefficients g1 and g2 of the amplifiers 64 and 75 are set at 1 and that the coefficient g3 of the amplifier 76 is set at 2, for example, the output Y of the 1:2 cascade delta-sigma modulator 58 can be represented by the following transfer function:

$$Y1 = Vin/A1 + N + (1-Z^{-1})Q1 \qquad (5)$$

$$Y2 = -Q1 \cdot A1/A2 + (1-Z^{-1})^2 Q2 \qquad (6)$$

$$Y = Y1 \cdot A1 + Y2 \cdot (1-Z^{-1}) \cdot A2 \quad (7)$$
$$= Vin + N \cdot A1 + (1-Z^{-1})^3 Q2 \cdot A2$$

$$Dout = Y \quad (8)$$
$$= Vin + N \cdot A1 + (1-Z^{-1})^3 Q2 \cdot A2$$

As a result, the gain limiting values of the delta-sigma modulation quantization loops 52 and 53 can be set individually and independently by changing the values of the scaling coefficients A1 and A2 in the 1:2 cascade delta-sigma modulator 58. In addition, the gains limited in the delta-sigma modulation quantization loops 52 and 53 can be compensated accurately by independently setting the gain in the noise reduction circuit 59 for each of the delta-sigma modulation quantization loops 52 and 53.

Figure 6:
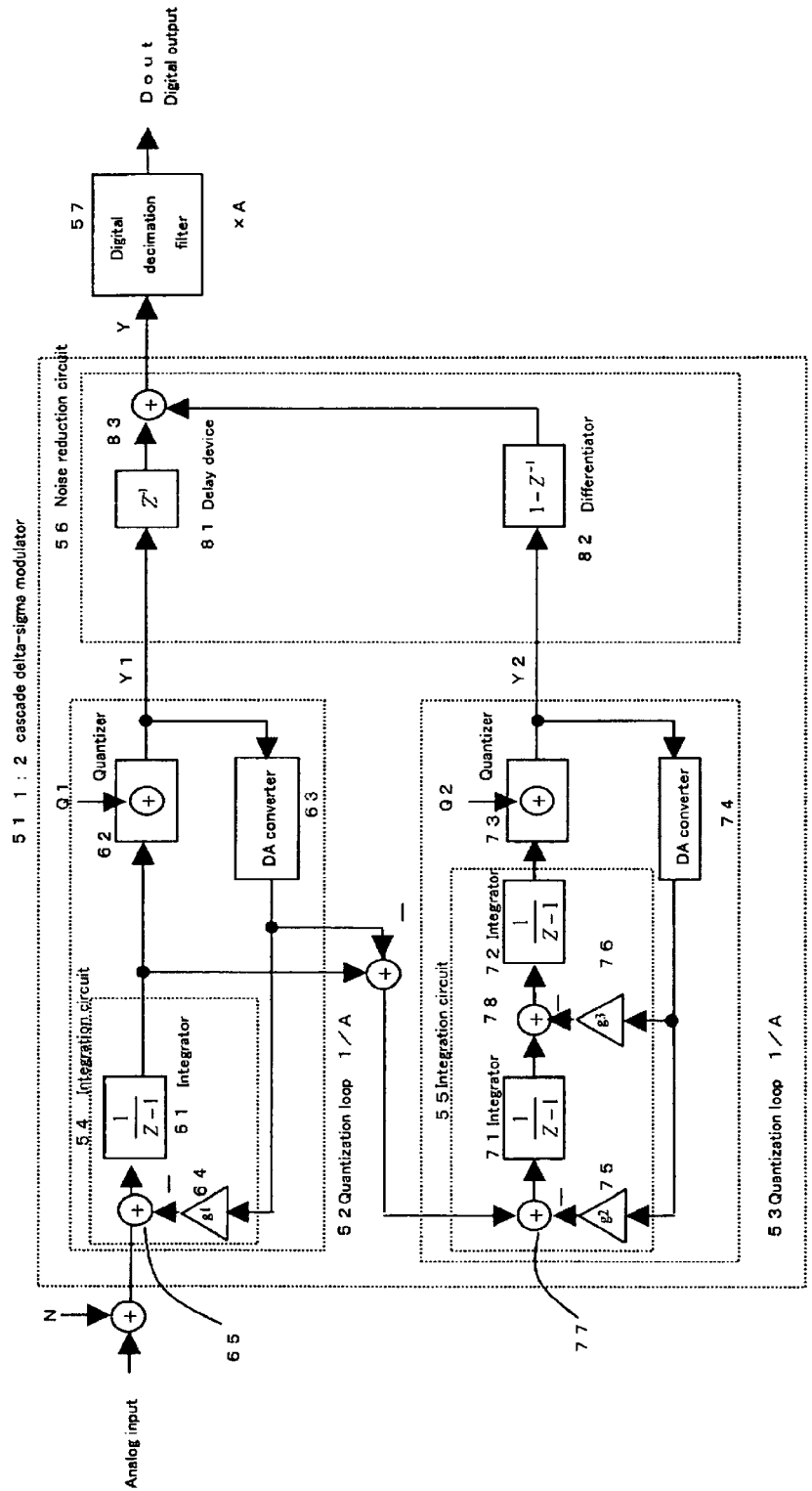
FIG. 6 is a block diagram showing the configuration of the A/D converter circuit incorporating the 1:2 cascade delta-sigma modulator in accordance with the prior art.

The higher the order of the integrator incorporated in a delta-sigma modulator, the lower the level of the analog input signal at which overload occurs. For this reason, it is necessary to increase the scaling coefficient. Hence, in the case when the order of the integration circuit 54 in the first-stage delta-sigma modulation quantization loop 52 is lower than the order of the integration circuit 55 in the second-stage delta-sigma modulation quantization loop 53 and the subsequent delta-sigma modulation quantization loops, the scaling coefficient A1 can be made smaller than the scaling coefficient A2. Hence, unlike the conventional scaling system represented by equation (4), the embodiment represented by equation (8) can make the value A in the analog noise component (N×A) smaller than that in the prior art shown in FIG. 6. As a result, the analog noise N in the signal frequency range can be reduced, and the S/N ratio can be improved.

Figure 2:
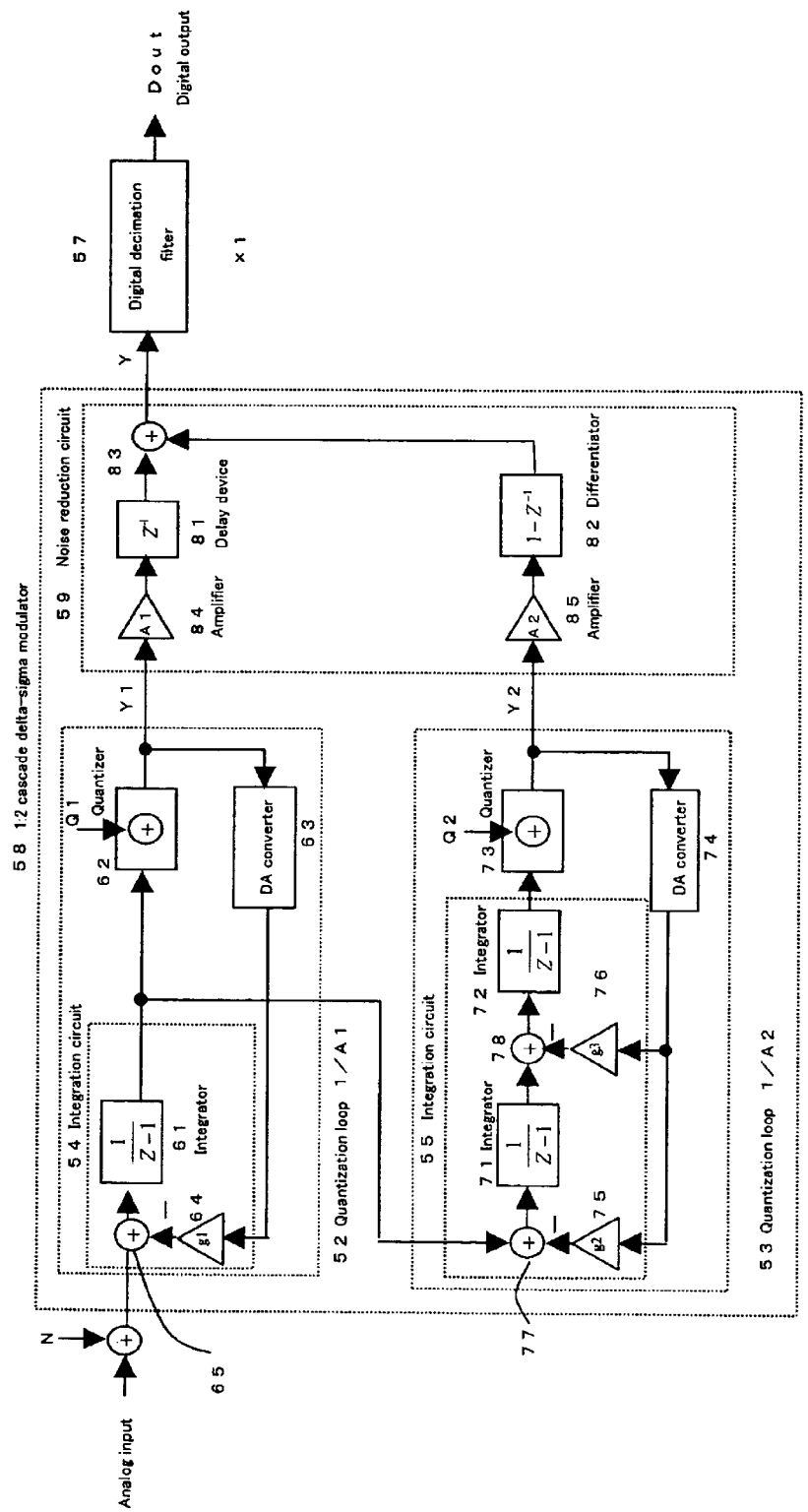
FIG. 2 is a block diagram showing the configuration of an A/D converter circuit incorporating a 1:2 cascade delta-sigma modulator in accordance with a second embodiment of the present invention.
Figure 3:
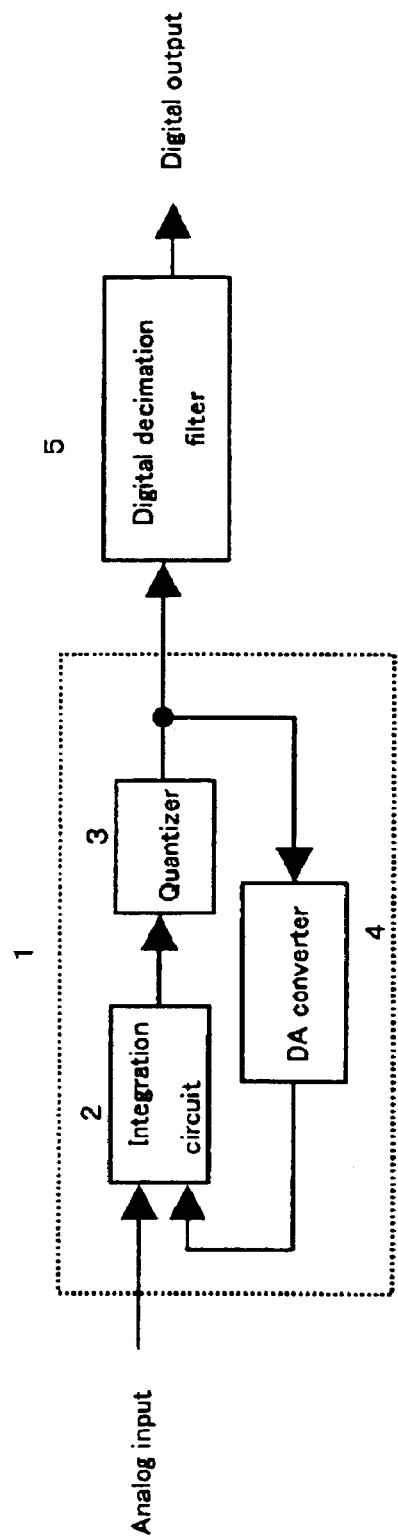
FIG. 3 is a block diagram showing the configuration of the A/D converter circuit incorporating the single-stage delta-sigma modulator in accordance with the prior art.
Figure 4:
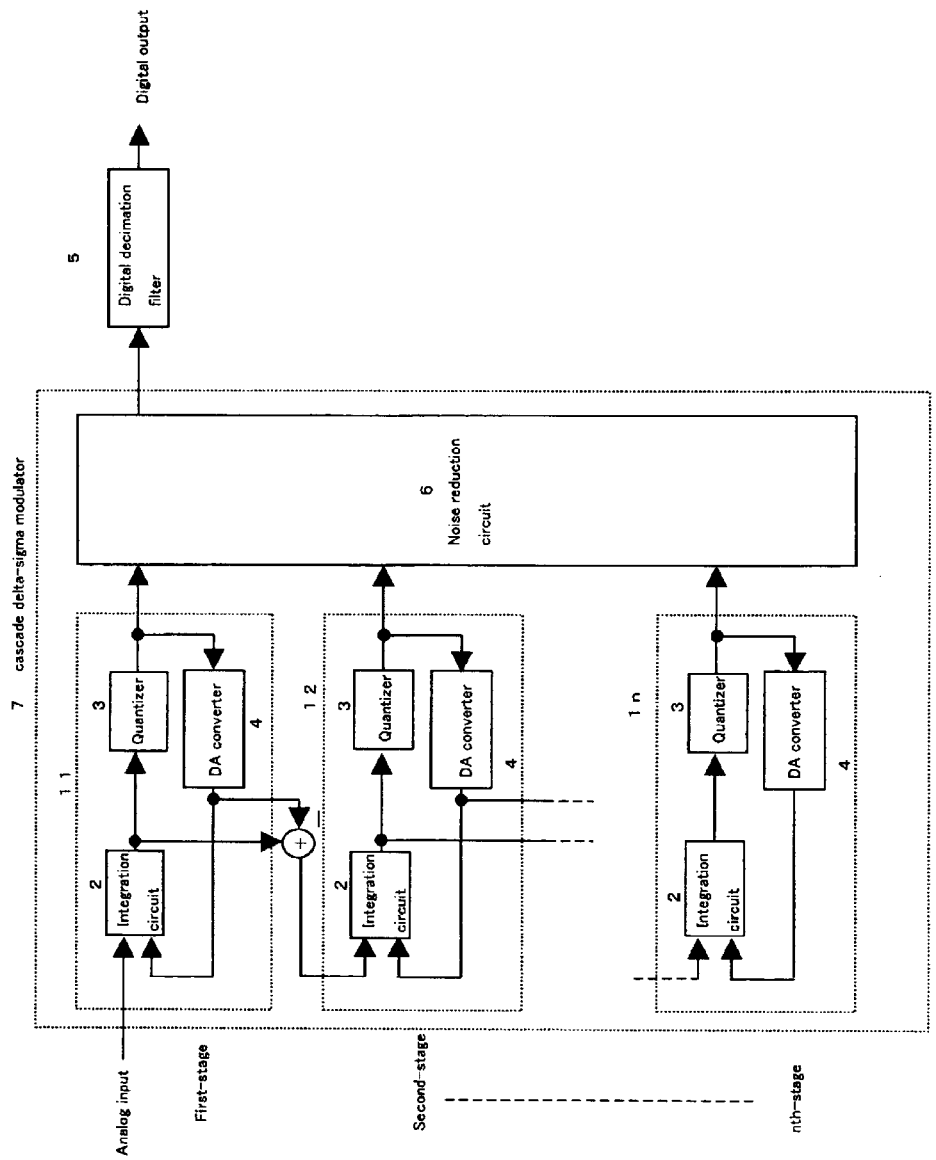
FIG. 4 is a block diagram showing the configuration of the A/D converter circuit incorporating the cascade delta-sigma modulator in accordance with the prior art.
Figure 5:
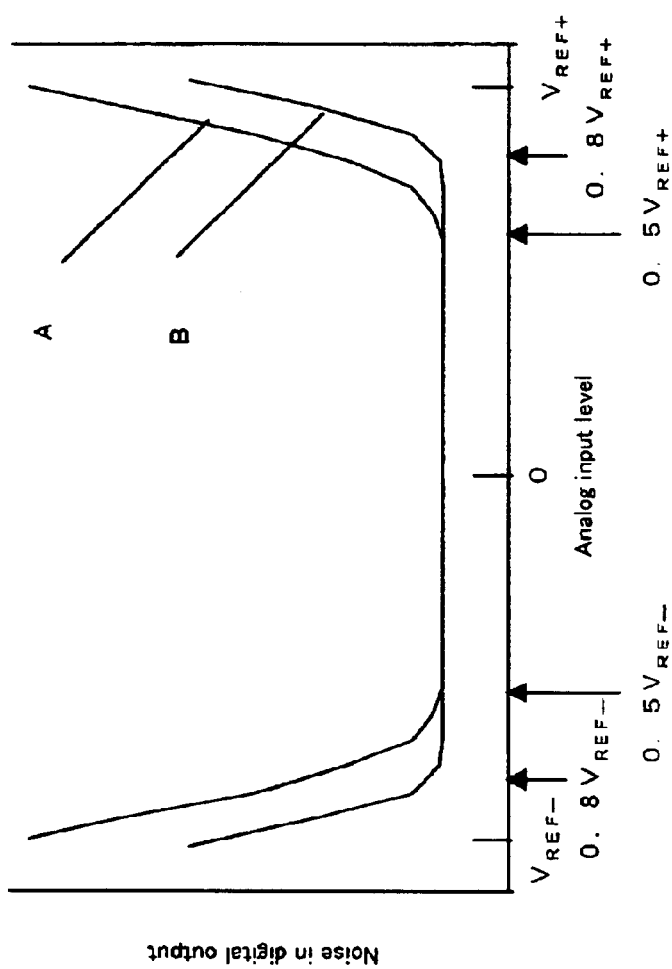
FIG. 5 is a characteristic diagram showing noise in the digital outputs of the modulators shown in FIGS. 3 and 4, depending on analog input level.

FIG. 2 is a block diagram showing an A/D converter incorporating a 1:2 cascade delta-sigma modulator in accordance with a second embodiment of the present invention.

This embodiment differs from the first embodiment in that the signal obtained by passing the feedback reference voltage generated by the DA converter 74 through the amplifier 75 is subtracted from the input of the quantizer 62 of the first-stage delta-sigma modulation quantization loop 52 by the adder/subtracter 77, and the signal obtained by the subtraction is input to the integrator 71. The other configurations are similar to those of the first embodiment.

In the second embodiment, when it is assumed that the coefficients g1 and g2 of the amplifiers 64 and 75 are set at 1 and that the coefficient g3 of the amplifier 76 is set at 2, for example, the output Y of the 1:2 cascade delta-sigma modulator 58 can be represented by the following transfer function:

$$Y1 = Vin/A1 + N + (1-Z^{-1})Q1 \quad (9)$$

$$Y2 = (Y1-Q1) \cdot A1/A2 + (1-Z^{-1})^2 Q2 \quad (10)$$

$$Y = Y1 \cdot A1 + Y2 \cdot (1-Z^{-1}) \cdot A2 \quad (11)$$
$$= Vin(2-Z^{-1}) + N \cdot A1 \cdot (2-Z^{-1}) +$$
$$(1-Z^{-1})^3 Q2 \cdot A2 + (1-Z^{-1})^2 \cdot Q1 \cdot A1$$

$$Dout = Y \quad (12)$$
$$= Vin(2-Z^{-1}) + N \cdot A1 \cdot (2-Z^{-1}) +$$
$$(1-Z^{-1})^3 Q2 \cdot A2 + (1-Z^{-1})^2 \cdot Q1 \cdot A1$$

As a result, the gain limiting values of the delta-sigma modulation quantization loops 52 and 53 can be set individually and independently by changing the values of the scaling coefficients A1 and A2 in the 1:2 cascade delta-sigma modulator 58. In addition, the gains limited in the delta-sigma modulation quantization loops 52 and 53 can be compensated accurately by independently setting the gain in the noise reduction circuit 59 for each of the delta-sigma modulation quantization loops 52 and 53. Hence, the analog noise N in the signal frequency range can be reduced, and the S/N ratio can be improved, just as in the case of the embodiment shown in FIG. 1.

The present invention is also applicable to an $X_1:X_2: \ldots :X_n$ cascade delta-sigma modulator, having n stages, wherein the orders of the integration circuits of the respective delta-sigma modulation quantization loops are $X_1$th, $X_2$th, $\ldots$, $X_n$th. This can be attained by setting the scaling coefficients of the respective delta-sigma modulation quantization loops at A1, A2, ... An, respectively, and by setting the gains of the amplifiers in the noise reduction circuit at A1, A2, ... An respectively corresponding to the respective delta-sigma modulation quantization loops connected to the noise reduction circuit.

Furthermore, at the time of gain scaling, the gain of the decimation filter 57 may remain fixed at 1, for example. Therefore, when the delta-sigma modulation A/D converter is designed, it is not necessary to consider the design of the decimation filter provided in the later stage, whereby the freedom of design can be enhanced.

What is claimed is:

1. A cascade delta-sigma modulator comprising:

a first-stage delta-sigma modulation quantization loop comprising a first integration circuit to which a first analog input signal, the maximum voltage of which is specified, and a first feedback reference voltage are input, a first local quantizer for quantizing the output of said first integration circuit into a digital signal, and a first DA converter for generating said first feedback reference voltage from the digital output of said first local quantizer, one or more delta-sigma modulation quantization loops, that is, second-stage and subsequent delta-sigma modulation quantization loops, each comprising a second integration circuit to which a second analog input signal formed of the difference signal between the input of the local quantizer and the output of the DA converter of the previous-stage delta-sigma modulation quantization loop and a second feedback reference voltage are input, a second local quantizer for quantizing the output of said second integration circuit into a digital signal, and a second DA converter for generating said second feedback reference voltage from the digital output of said second local quantizer, said second-stage and subsequent delta-sigma modulation quantization loops being cascade-connected to said first-stage delta-sigma modulation quantization loop, and a noise reduction circuit, in said first-stage, second-stage and subsequent delta-sigma modulation quantization loops, for canceling the quantization noise of each of said delta-sigma modulation quantization loops by adding the output obtained by delaying the output of said local quantizer of each of said delta-sigma modulation quantization loops using a delay device to the output obtained by differentiating the output of said local quantizer of the next-stage delta-sigma modulation quantization loop using a differentiator and by using the value obtained by the addition as the output signal thereof, said cascade delta-sigma modulator further comprising gain limiting means for limiting the gain of each of said delta-sigma modulation quantization loops by setting the feedback reference voltage of each of said delta-sigma modulation quantization loops at the specified maximum voltage or more of said analog input signal and by setting the feedback reference voltage of each of said delta-sigma modulation quantization loops so as to be independent of the feedback reference voltages of the other delta-sigma modulation quantization loops, and scale compensating means for compensating the gain limited in each of said delta-sigma modulation quantization loops by independently setting the gain in said noise reduction circuit for each of said delta-sigma modulation quantization loops.

2. A cascade delta-sigma modulator in accordance with claim 1, wherein said first integration circuit integrates the difference between said first analog input signal and said first feedback reference voltage.

3. A cascade delta-sigma modulator in accordance with claim 1, wherein said gain limiting means sets said feedback reference voltage depending on the order of said integration circuit in each of said delta-sigma modulation quantization loops.

4. A cascade delta-sigma modulator in accordance with claim 1, wherein said delay device and said differentiator are provided in the input section of said noise reduction circuit from each of said delta-sigma modulation quantization loops, and said scale compensating means is formed of multiplying means, provided on the input sides or the output sides of said delay device and said differentiator provided in the input section of said noise reduction circuit from each of said delta-sigma modulation quantization loops, for multiplying the coefficient for compensating the gain limited in each of said delta-sigma modulation quantization loops to the signals passing through said delay device and said differentiator.

5. A cascade delta-sigma modulator in accordance with claim 1, wherein said scale compensating means has gain setting devices for individually setting gain limiting values in the input section of said noise reduction circuit from each of said delta-sigma modulation quantization loops.

6. A cascade delta-sigma modulator comprising:

a first-stage delta-sigma modulation quantization loop comprising a first integration circuit to which a first analog input signal, the maximum voltage of which is specified, and a first feedback reference voltage are input, a first local quantizer for quantizing the output of said first integration circuit into a digital signal, and a first DA converter for generating said first feedback reference voltage from the digital output of said first local quantizer, one or more delta-sigma modulation quantization loops, that is, second-stage and subsequent delta-sigma modulation quantization loops, each comprising a second integration circuit to which a second analog input signal formed of the input of the local quantizer of the previous-stage delta-sigma modulation quantization loop and a second feedback reference voltage are input, a second local quantizer for quantizing the output of said second integration circuit into a digital signal, and a second DA converter for generating said second feedback reference voltage from the digital output of said second local quantizer, said second-stage and subsequent delta-sigma modulation quantization loops being cascade-connected to said first-stage delta-sigma modulation quantization loop, and a noise reduction circuit, in said first-stage, second-stage and subsequent delta-sigma modulation quantization loops, for canceling the quantization noise of each of said delta-sigma modulation quantization loops by adding the output obtained by delaying the output of said local quantizer of each of said delta-sigma modulation quantization loops using a delay device to the output obtained by differentiating the output of said local quantizer of the next-stage delta-sigma modulation quantization loop using a differentiator and by using the value obtained by the addition as the output signal thereof, said cascade delta-sigma modulator further comprising gain limiting means for limiting the gain of each of said delta-sigma modulation quantization loops by setting the feedback reference voltage of each of said delta-sigma modulation quantization loops at the specified maximum voltage or more of said analog input signal and by setting the feedback reference voltage of each of said delta-sigma modulation quantization loops so as to be independent of the feedback reference voltages of the other delta-sigma modulation quantization loops, and scale compensating means for compensating the gain limited in each of said delta-sigma modulation quantization loops by independently setting the gain in said noise reduction circuit for each of said delta-sigma modulation quantization loops.

7. A cascade delta-sigma modulator in accordance with claim 6, wherein said first integration circuit integrates the difference between said first analog input signal and said first feedback reference voltage.

8. A cascade delta-sigma modulator in accordance with claim 6, wherein said gain limiting means sets said feedback reference voltage depending on the order of said integration circuit in each of said delta-sigma modulation quantization loops.

9. A cascade delta-sigma modulator in accordance with claim 6, wherein said delay device and said differentiator are provided in the input section of said noise reduction circuit from each of said delta-sigma modulation quantization loops, and said scale compensating means is formed of multiplying means, provided on the input sides or the output sides of said delay device and said differentiator provided in the input section of said noise reduction circuit from each of said delta-sigma modulation quantization loops, for multiplying the coefficient for compensating the gain limited in each of said delta-sigma modulation quantization loops to the signals passing through said delay device and said differentiator.

10. A cascade delta-sigma modulator in accordance with claim 6, wherein said scale compensating means has gain setting devices for individually setting gain limiting values in the input section of said noise reduction circuit from each of said delta-sigma modulation quantization loops.

* * * * *